US012805207B2

(12) United States Patent
Wang et al.

(10) Patent No.: US 12,805,207 B2
(45) Date of Patent: Nov. 17, 2026

(54) RESISTIVE MEMORY DEVICE AND MANUFACTURING METHOD THEREOF

(71) Applicant: UNITED MICROELECTRONICS CORP., Hsin-Chu City (TW)

(72) Inventors: Wen-Jen Wang, Tainan City (TW); Hsiang-Hung Peng, Hsinchu County (TW); Yu-Huan Yeh, Hsinchu City (TW); Chuan-Fu Wang, Miaoli County (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 553 days.

(21) Appl. No.: 18/218,602

(22) Filed: Jul. 6, 2023

(65) Prior Publication Data

US 2024/0407273 A1 Dec. 5, 2024

(30) Foreign Application Priority Data

Jun. 5, 2023 (TW) ................................ 112120871

(51) Int. Cl.
*H10N 70/00* (2023.01)
*H10B 63/00* (2023.01)
*H10N 70/20* (2023.01)

(52) U.S. Cl.
CPC ........... *H10N 70/841* (2023.02); *H10B 63/00* (2023.02); *H10N 70/063* (2023.02); *H10N 70/24* (2023.02); *H10N 70/8265* (2023.02)

(58) Field of Classification Search
CPC . H10N 70/826; H10N 70/841; H10N 70/8833
See application file for complete search history.

(56) References Cited

U.S. PATENT DOCUMENTS 11,387,412 B2 * 7/2022 Yang ..................... H10B 63/20

FOREIGN PATENT DOCUMENTS

TW 202201742 A 1/2022

* cited by examiner

*Primary Examiner* — Mark V Prenty
(74) *Attorney, Agent, or Firm* — Winston Hsu

(57) ABSTRACT

A resistive memory device includes a first dielectric layer, a via connection structure, and a resistive switching element. The via connection structure is disposed in the first dielectric layer, and the resistive switching element is disposed on the via connection structure and the first dielectric layer. The resistive switching element includes a titanium bottom electrode, a titanium top electrode, and a variable resistance material. The titanium top electrode is disposed above the titanium bottom electrode, and the variable resistance material is sandwiched between the titanium bottom electrode and the titanium top electrode in a vertical direction. The variable resistance material is directly connected with the titanium bottom electrode and the titanium top electrode, and the titanium bottom electrode is directly connected with the via connection structure.

16 Claims, 8 Drawing Sheets

RESISTIVE MEMORY DEVICE AND MANUFACTURING METHOD THEREOF

BACKGROUND OF THE INVENTION

1. Field of the Invention

The present invention relates to a resistive memory device and a manufacturing method thereof, and more particularly, to a resistive memory device including a titanium bottom electrode and a manufacturing method thereof.

2. Description of the Prior Art

Semiconductor memory devices are used in computer and electronics industries as a means for retaining digital information or data. Typically, the semiconductor memory devices are divided into volatile and non-volatile memory devices. The volatile memory device is a computer memory that loses its stored data when power to the operation is interrupted. Comparatively, in the non-volatile memory device, the stored data will not be lost when the power supply is interrupted. The resistive random access memory (RRAM) is a kind of non-volatile memory technology having the characteristics of low operating voltage, low power consumption, and high writing speed and is regarded as a memory structure that can be applied to many electronic devices.

SUMMARY OF THE INVENTION

A resistive memory device and a manufacturing method thereof are provided in the present invention. A resistive switching element is formed with a titanium bottom electrode, a titanium top electrode, and a variable resistance material sandwiched between the titanium bottom electrode and the titanium top electrode for reducing the total thickness of the resistive switching element and improving related manufacturing problems.

According to an embodiment of the present invention, a resistive memory device is provided. The resistive memory device includes a first dielectric layer, a via connection structure, and a resistive switching element. The via connection structure is disposed in the first dielectric layer, and the resistive switching element is disposed on the via connection structure and the first dielectric layer. The resistive switching element includes a titanium bottom electrode, a titanium top electrode, and a variable resistance material. The titanium top electrode is disposed above the titanium bottom electrode, and the variable resistance material is sandwiched between the titanium bottom electrode and the titanium top electrode in a vertical direction. The variable resistance material is directly connected with the titanium bottom electrode and the titanium top electrode, and the titanium bottom electrode is directly connected with the via connection structure.

According to an embodiment of the present invention, a manufacturing method of a resistive memory device is provided. The manufacturing method includes the following steps. A via connection structure is formed in a first dielectric layer, and a resistive switching element is formed on the via connection structure and the first dielectric layer. The resistive switching element includes a titanium bottom electrode, a titanium top electrode, and a variable resistance material. The titanium top electrode is disposed above the titanium bottom electrode, and the variable resistance material is sandwiched between the titanium bottom electrode and the titanium top electrode in a vertical direction. The variable resistance material is directly connected with the titanium bottom electrode and the titanium top electrode, and the titanium bottom electrode is directly connected with the via connection structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-8 are schematic drawings illustrating a manufacturing method of the resistive memory device according to an embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing illustrating applying voltage to a titanium top electrode in a forming step, FIG. 7 is a schematic drawing illustrating applying voltage to a titanium bottom electrode in the forming step, and FIG. 8 is a schematic drawing in a step subsequent the forming step.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
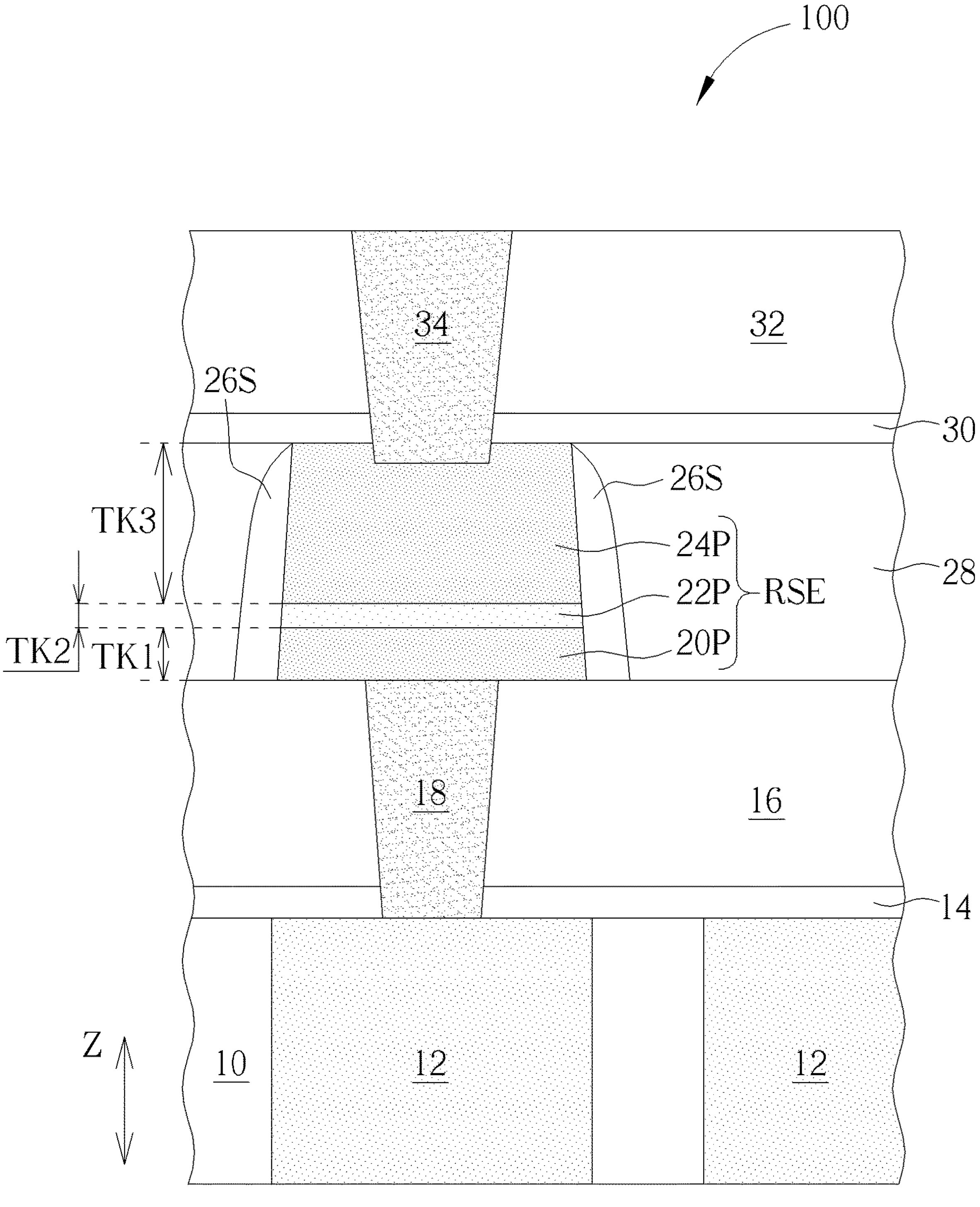
FIG. 1 is a schematic drawing illustrating a resistive memory device according to an embodiment of the present invention.

Please refer to FIG. 1. FIG. 1 is a schematic drawing illustrating a resistive memory device 100 according to a first embodiment of the present invention. As shown in FIG. 1, the resistive memory device 100 includes a first dielectric layer (such as a dielectric layer 16), a via connection structure 18, and a resistive switching element RSE. The via connection structure 18 is disposed in the dielectric layer 16, and the resistive switching element RSE is disposed on the via connection structure 18 and the dielectric layer 16. The resistive switching element RSE includes a titanium bottom electrode 20P, a titanium top electrode 24P, and a variable resistance material 22P. The titanium top electrode 24P is disposed above the titanium bottom electrode 20P, and the variable resistance material 22P is sandwiched between the titanium bottom electrode 20P and the titanium top electrode 24P in a vertical direction Z. The variable resistance material 22P is directly connected with the titanium bottom electrode 20P and the titanium top electrode 24P, respectively, and the titanium bottom electrode 20P is directly connected with the via connection structure 18. By forming the resistive switching element RSE with the titanium bottom electrode 20P, the variable resistance material 22P, and the titanium top electrode 24P, the total thickness of the resistive switching element RSE may be reduced for improving related manufacturing problems.

In some embodiments, the resistive memory device 100 may further include a dielectric layer 10, an electrically conductive line 12, and an etching stop layer 14. The electrically conductive line 12 may be disposed in the dielectric layer 10, the etching stop layer 14 may be disposed between the dielectric layer 16 and the dielectric layer 10, and the via connection structure 18 may penetrate through the dielectric layer 16 and the etching stop layer 14 located on the electrically conductive line 12 in the vertical direction Z. A bottom surface of the via connection structure 18 may contact and be electrically connected with the electrically conductive line 12, and a top surface of the via connection structure 18 and a top surface of the dielectric layer 16 may be substantially coplanar, but not limited thereto. It is worth noting that, in this description, a top surface of a specific component may include the topmost surface of this component in the vertical direction Z, and a bottom surface of a specific component may include the bottommost surface of this component in the vertical direction Z, but not limited thereto. In some embodiments, the dielectric layer 10, the etching stop layer 14, and the dielectric layer 16 may include silicon oxide, silicon nitride, nitrogen doped carbide (NDC), silicon carbon nitride, fluorosilicate glass (FSG), or other suitable dielectric materials (such as low dielectric constant dielectric materials, but not limited thereto), and the via connection structure 18 and the electrically conductive line 12 may include a barrier layer and a low electrical resistivity material disposed on this barrier layer, but not limited thereto. The low electrical resistivity material described above may include a material with relatively low electrical resistivity, such as copper, aluminum, tungsten, and so forth, and the barrier layer described above may include titanium nitride, tantalum nitride, or other suitable electrically conductive barrier materials. In some embodiments, the dielectric layer 10 may be disposed on a substrate (not illustrated), and the substrate may include a semiconductor substrate, such as silicon substrate, silicon germanium substrate, silicon-on-insulator (SOI) substrate, or a substrate made of other suitable materials. In addition, before the step of forming the dielectric layer 10, other units (such as transistors) and/or other circuits (not illustrated) may be formed on the substrate described above, and the electrically conductive line 12 may be electrically connected downwardly with the units and/or the circuits on the substrate, but not limited thereto. In some embodiments, the manufacturing method of the resistive memory device 100 may be integrated with the back end of line (BEOL) process in the semiconductor manufacturing process. The dielectric layer 10, the etching stop layer 14, and the dielectric layer 16 described above may be regarded as interlayer dielectric layers formed in the BEOL process, and the electrically conductive line 12 and the via connection structure 18 described above may be regarded as a portion of an interconnection structure formed in the BEOL process, but not limited thereto.

In some embodiments, the vertical direction Z described above may be regarded as a thickness direction of the dielectric layer 10 and/or the dielectric layer 16. The dielectric layer 10 may have a top surface and a bottom surface opposite to the top surface in the vertical direction Z, and the dielectric layer 16, the via connection structure 18, and the resistive switching element RSE may be disposed at the side of the top surface of the dielectric layer 10. Horizontal directions substantially orthogonal to the vertical direction Z may be substantially parallel with the top surface and/or the bottom surface of the dielectric layer 10, but not limited thereto. In this description, a distance between the bottom surface of the dielectric layer 10 and a relatively higher location and/or a relatively higher part in the vertical direction Z may be greater than a distance between the bottom surface of the dielectric layer 10 and a relatively lower location and/or a relatively lower part in the vertical direction Z. The bottom or a lower portion of each component may be closer to the bottom surface of the dielectric layer 10 in the vertical direction Z than the top or upper portion of this component. Another component disposed above a specific component may be regarded as being relatively far from the bottom surface of the dielectric layer 10 in the vertical direction Z, and another component disposed under a specific component may be regarded as being relatively close to the bottom surface of the dielectric layer 10 in the vertical direction Z.

In some embodiments, the titanium bottom electrode 20P and the titanium top electrode 24P may consist of titanium, and the titanium bottom electrode 20P and the titanium top electrode 24P may be regarded as substantially pure titanium electrodes. In some embodiments, the material composition of the titanium bottom electrode 20P and the titanium top electrode 24P may be titanium mainly, and except titanium, the titanium bottom electrode 20P and the titanium top electrode 24P may further include some tiny impurities that cannot be avoided in the manufacturing processes. In addition, the variable resistance material 22P consists of a metal oxide material, and this metal oxide material may include a single layer or multiple layers of metal oxide, such as hafnium oxide, tantalum oxide, or other suitable metal oxide. In some embodiments, the titanium bottom electrode 20P may directly contact the variable resistance material 22P, the via connection structure 18, and the dielectric layer 16, and the material composition of the via connection structure 18 is different from the material composition of the titanium bottom electrode 20P. For example, the titanium bottom electrode 20P and the titanium top electrode 24P may be pure titanium electrodes for attracting oxygen ions in the variable resistance material 22P and forming oxygen vacancies in the variable resistance material 22P when operating the resistive switching element RSE, and the via connection structure 18 may include a low resistivity material different from titanium for reducing the resistance of the via connection structure 18, but not limited thereto.

In some embodiments, a thickness TK1 of the titanium bottom electrode 20P in the vertical direction Z may be less than a thickness TK3 of the titanium top electrode 24P in the vertical direction Z, and the thickness TK1 of the titanium bottom electrode 20P in the vertical direction may be greater than a thickness TK2 of the variable resistance material 22P in the vertical direction Z. For example, the total thickness of the resistive switching element RSE may be relatively reduced by reducing the thickness TK1 of the titanium bottom electrode 20P for improving related process problems, a corresponding connection structure (such as a top connection structure 34) has to be disposed on the titanium top electrode 24P, and the titanium top electrode 24P must have a certain thickness for improving negative influence of the manufacturing process of forming the connection structure, such as reducing etching damage to the titanium top electrode 24P and/or avoiding the condition that the titanium top electrode 24P is etched through by related etching processes. Therefore, the thickness TK3 of the titanium top electrode 24P may be greater than the thickness TK1 of the titanium bottom electrode 20P. In addition, excessive thickness of the variable resistance material 22P may cause operational difficulties (such as influencing operating voltage, but not limited thereto), and the thickness TK2 of the variable resistance material 22P may be less than the thickness TK1 of the titanium bottom electrode 20P accordingly.

In some embodiments, the resistive memory device 100 may further include a spacer structure 26S disposed on a sidewall of the resistive switching element RSE. The spacer structure 26S may directly contact a sidewall of the titanium bottom electrode 20P, a sidewall of the variable resistance material 22P, and a sidewall of the titanium top electrode 24P, and the variable resistance material 22P may be completely encompassed by the titanium bottom electrode 20P, the titanium top electrode 24P, and the spacer structure 26S accordingly for avoiding oxygen in other material layers and/or oxygen in the environment from influencing the oxygen vacancies in the variable resistance material 22P, but not limited thereto. In some embodiments, the spacer structure 26S may include a nitride insulation material (such as silicon nitride) or other suitable insulation materials that do not contain oxygen.

In some embodiments, the resistive memory device 100 may further include a dielectric layer 28, and etching stop layer 30, a second dielectric layer (such as a dielectric layer 32), and a top connection structure 34. The dielectric layer 28 may be disposed on the dielectric layer 16 and surround the spacer structure 26S and the resistive switching element RSE in the horizontal directions. The etching stop layer 30 may be disposed on the dielectric layer 28 and the resistive switching element RSE, and the dielectric layer 32 may be disposed on the etching stop layer 30. Therefore, the dielectric layer 32 may be regarded as being disposed on the etching stop layer 30, the dielectric layer 28, and the resistive switching element RSE. The top connection structure 34 may be at least partially disposed in the dielectric layer 32 and the etching stop layer 30, and the top connection structure 34 may penetrate through the dielectric layer 32 and the etching stop layer 30 in the vertical direction Z for contacting the titanium top electrode 24P. Therefore, the top connection structure 34 may be directly connected with the titanium top electrode 24P.

In some embodiments, the dielectric layer 28, the etching stop layer 30, and the dielectric layer 32 may include silicon oxide, silicon nitride, nitrogen doped carbide (NDC), silicon carbon nitride, fluorosilicate glass (FSG), or other suitable dielectric materials (such as low dielectric constant dielectric materials, but not limited thereto), and the top connection structure 34 may include a barrier layer and a low electrical resistivity material disposed on this barrier layer, but not limited thereto. The low electrical resistivity material described above may include a material with relatively low electrical resistivity, such as copper, aluminum, tungsten, and so forth, and the barrier layer described above may include titanium nitride, tantalum nitride, or other suitable electrically conductive barrier materials. In some embodiments, the titanium top electrode 24P may be a pure titanium electrode for attracting oxygen ions in the variable resistance material 22P more easily and forming oxygen vacancies in the variable resistance material 22P when operating the resistive switching element RSE, and the top connection structure 34 may include a low resistivity material different from titanium for reducing the resistance of the top connection structure 34. Therefore, the material composition of the top connection structure 34 may be different from the material composition of the titanium top electrode 24P. In some embodiments, because of the influence of the manufacturing process, the top surface of the titanium top electrode 24P and the top surface of the dielectric layer 28 may be substantially coplanar, but not limited thereto. The top surface of the titanium top electrode 24P may directly contact the etching stop layer 30, and the bottom surface of the top connection structure 34 may be lower than the top surface of the titanium top electrode 24P in the vertical direction Z.

Figure 2:
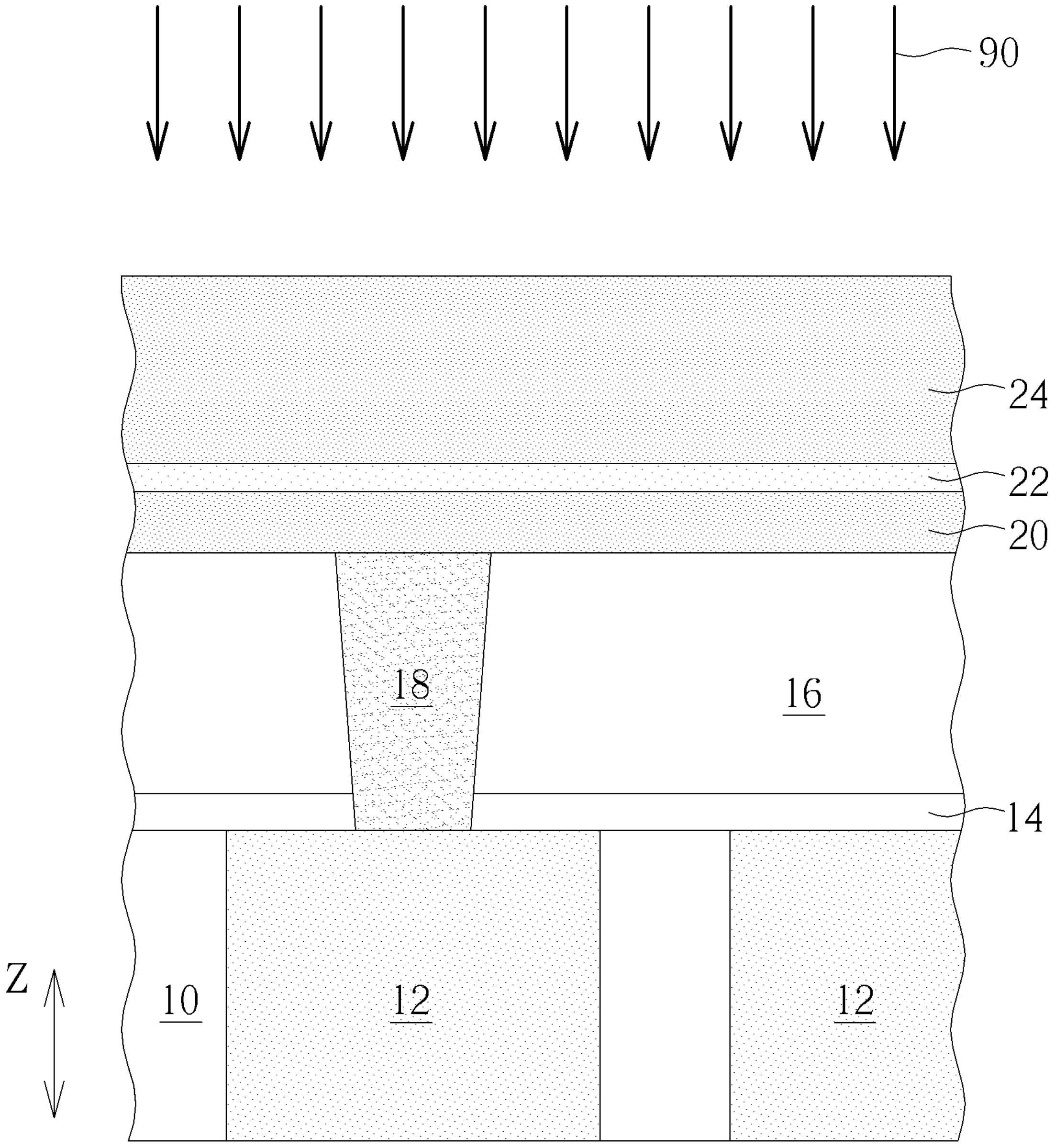
Figure 3:
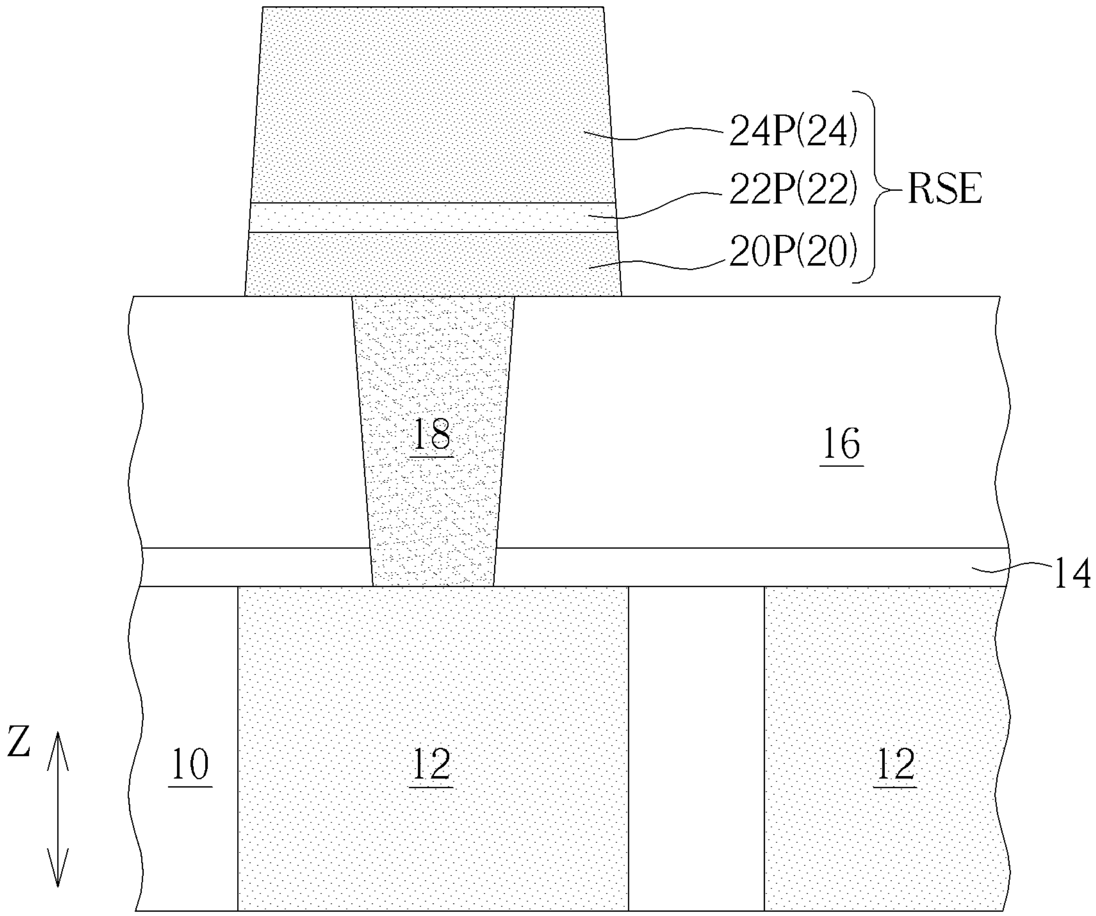
Figure 4:
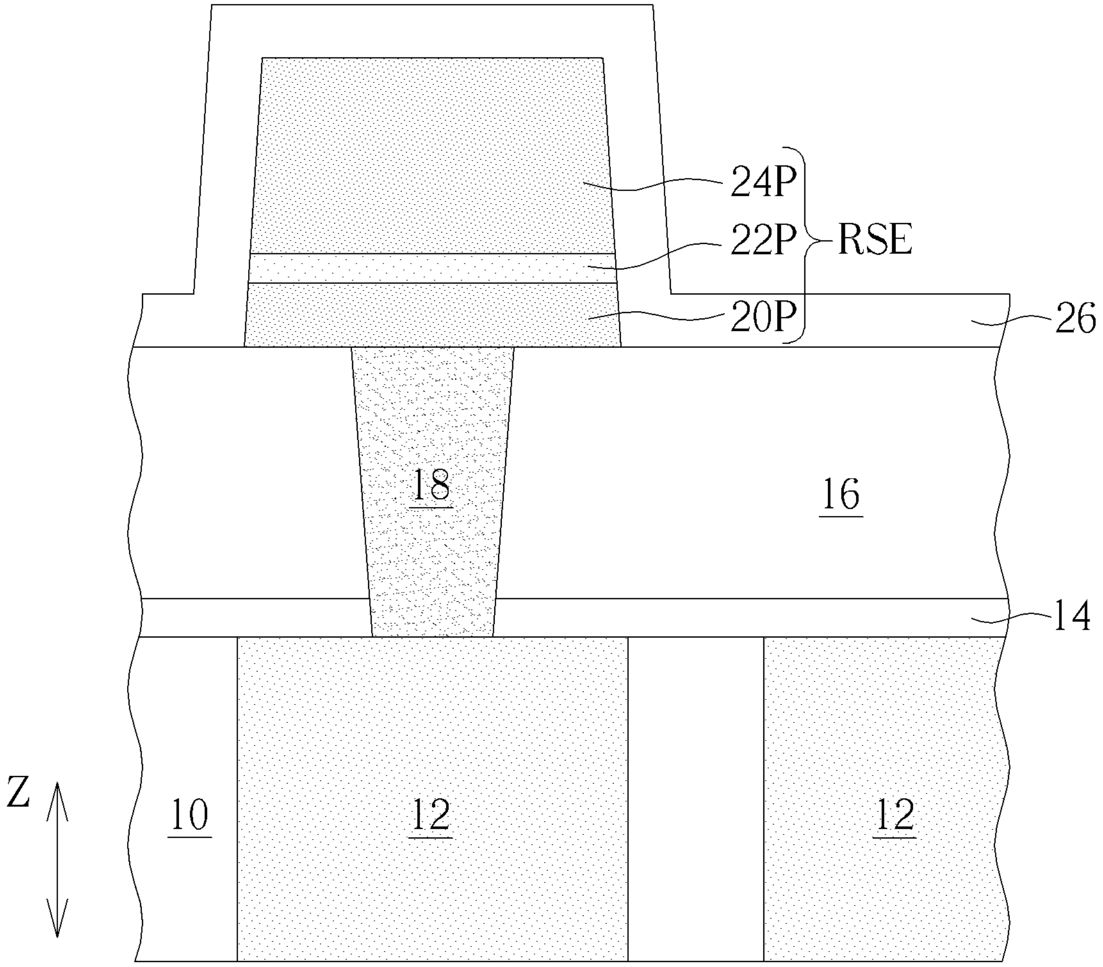
Figure 5:
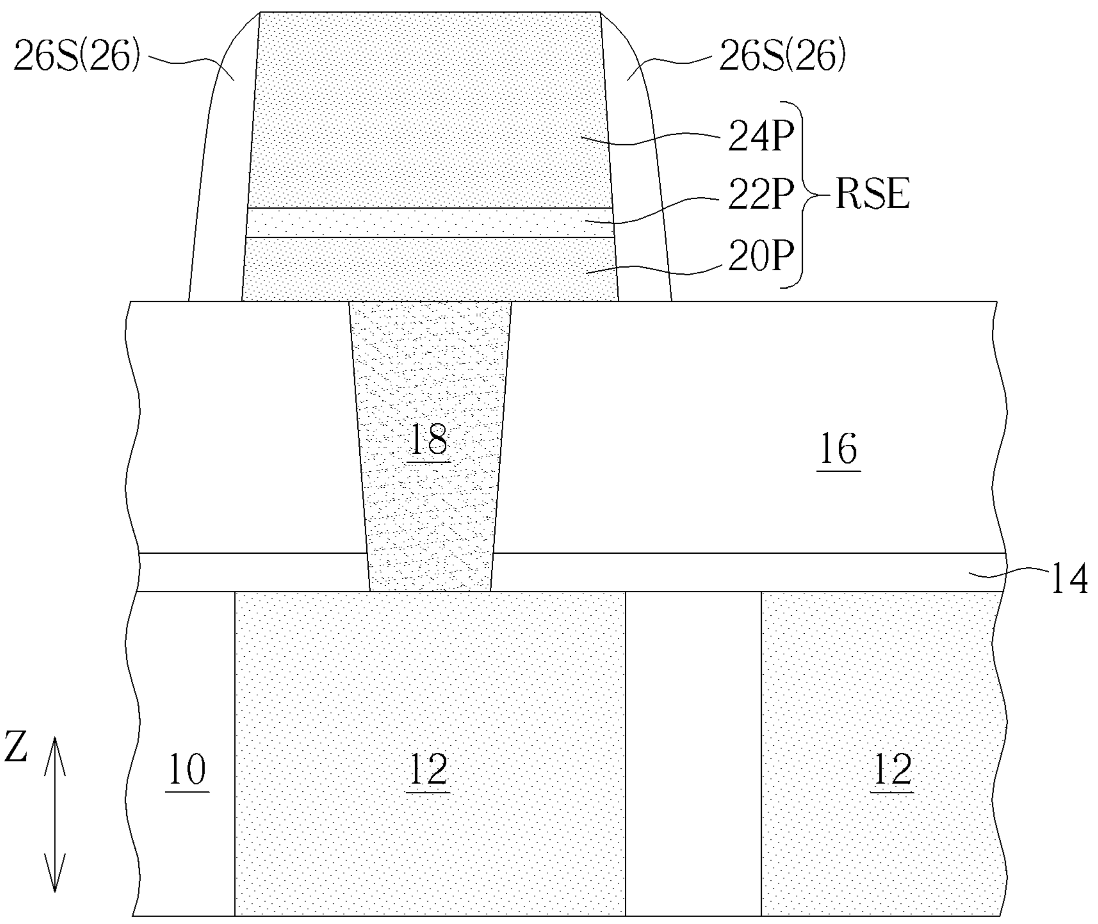
Figure 6:
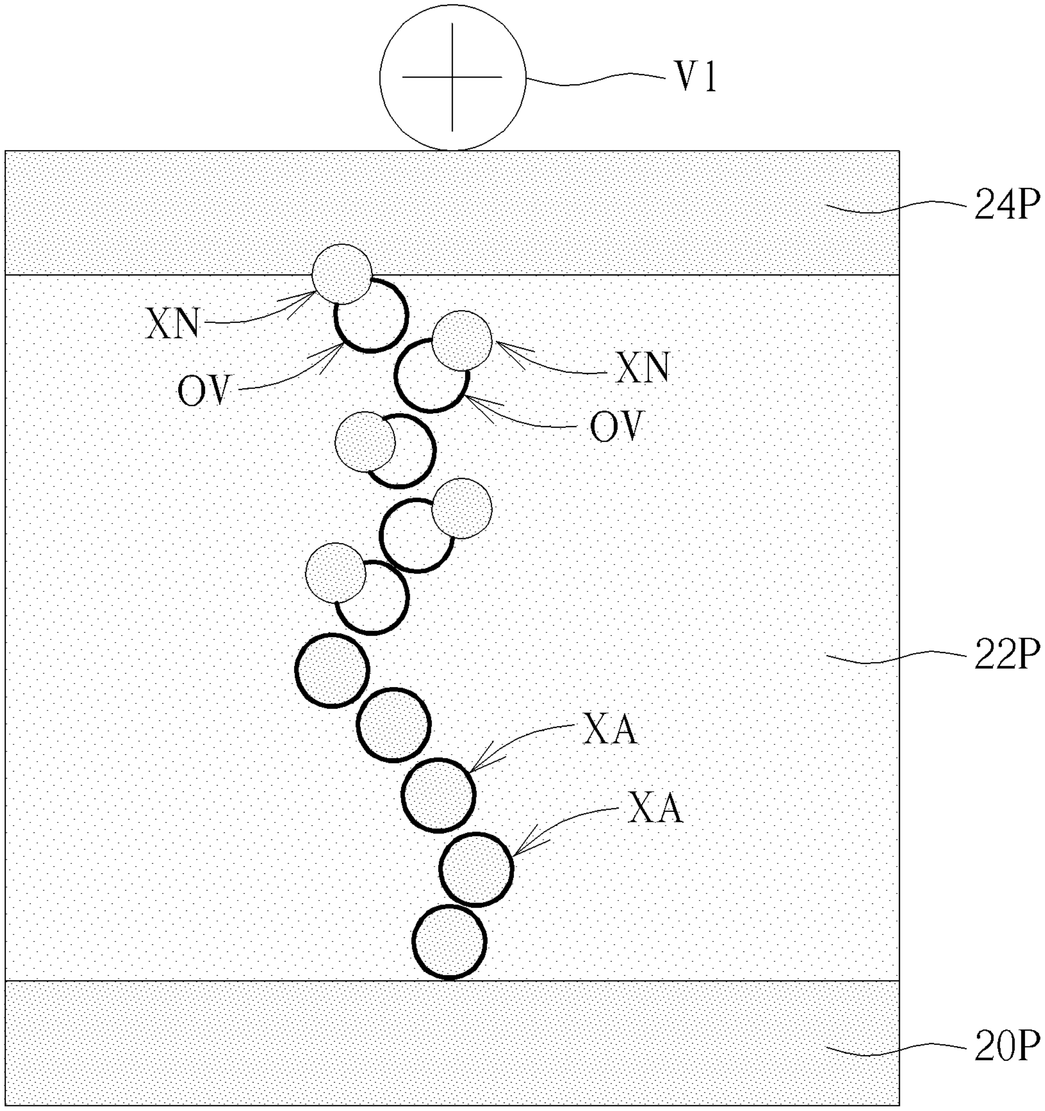
Figure 7:
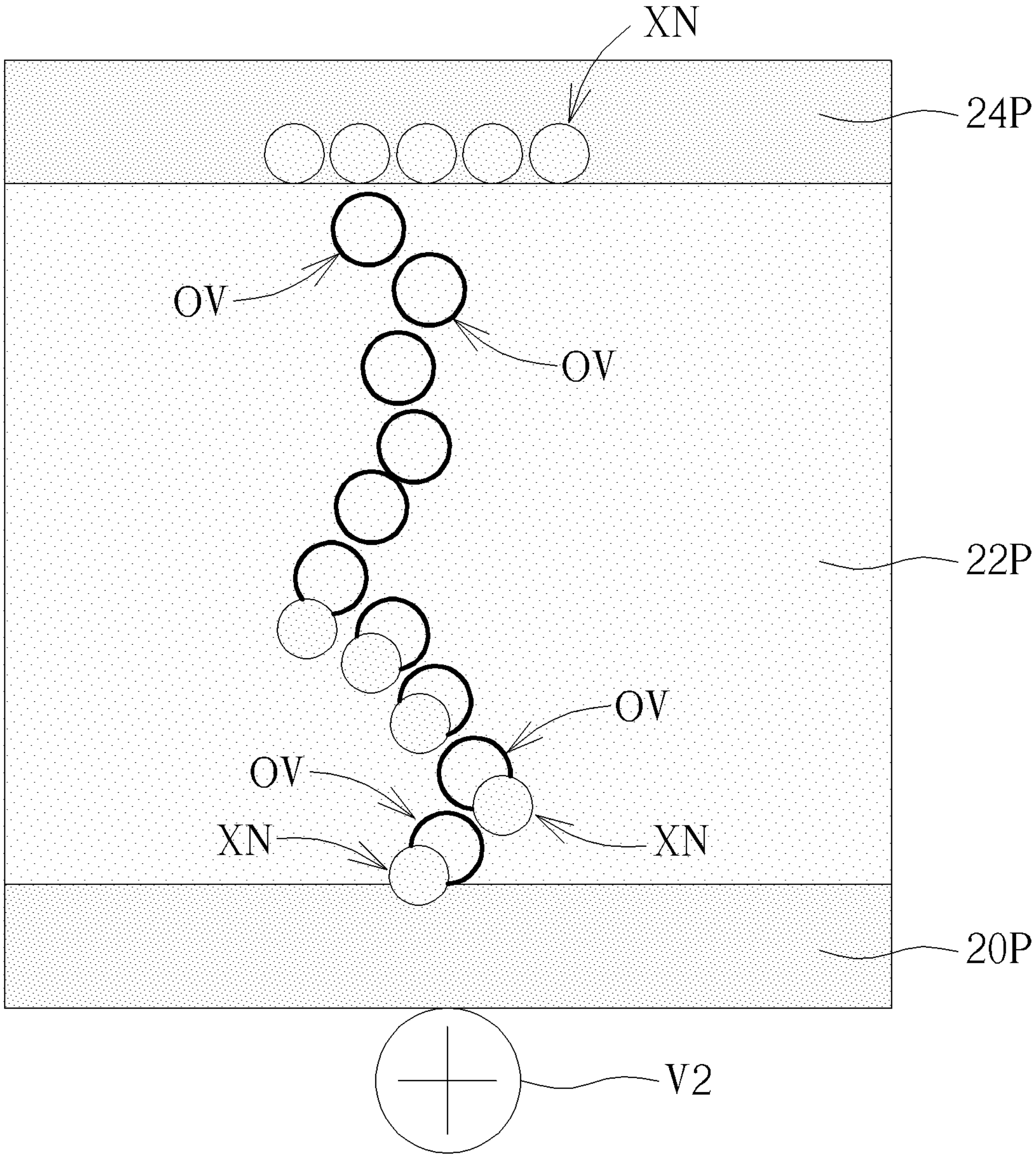
Figure 8:
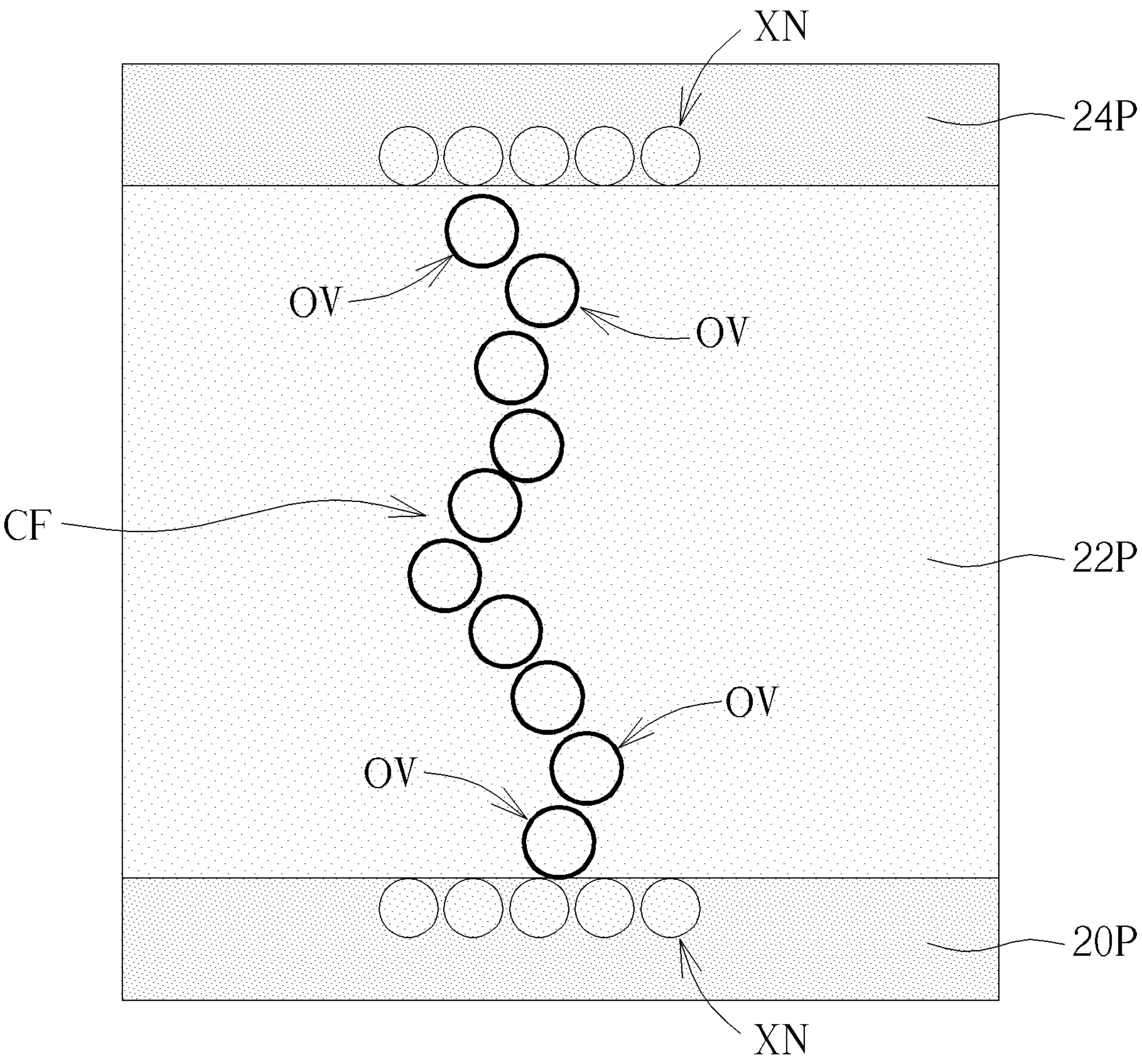

Please refer to FIGS. 1-8. FIGS. 2-8 are schematic drawings illustrating a manufacturing method of the resistive memory device according to an embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing illustrating applying voltage to the titanium top electrode in a forming step, FIG. 7 is a schematic drawing illustrating applying voltage to the titanium bottom electrode in the forming step, and FIG. 8 is a schematic drawing in a step subsequent the forming step. In some embodiments, FIG. 1 may be regarded as a schematic drawing in a step subsequent to FIG. 5, but not limited thereto. As shown in FIG. 1, the manufacturing method of the resistive memory device 100 in this embodiment may include the following steps. The via connection structure 18 is formed in a first dielectric layer (such as the dielectric layer 16), and the resistive switching element RSE is formed on the via connection structure 18 and the dielectric layer 16. The resistive switching element RSE includes the titanium bottom electrode 20P, the titanium top electrode 24P, and the variable resistance material 22P. The titanium top electrode 24P is disposed above the titanium bottom electrode 20P, and the variable resistance material 22P is sandwiched between the titanium bottom electrode 20P and the titanium top electrode 24P in the vertical direction Z. The variable resistance material 22P is directly connected with the titanium bottom electrode 20P and the titanium top electrode 24P, respectively, and the titanium bottom electrode 20P is directly connected with the via connection structure 18.

Specifically, the manufacturing method in this invention may include but is not limited to the following steps. As shown in FIG. 2, after the electrically conductive line 12 is formed in the dielectric layer 10, the etching stop layer 14 and the dielectric layer 16 may be formed on the dielectric layer 10 and the electrically conductive line 12. Subsequently, the via connection structure 18 may be formed penetrating through the dielectric layer 16 and the etching stop layer 16 located above the electrically conductive line 12 in the vertical direction Z for contacting and being electrically connected with the electrically conductive line 12. In some embodiments, the via connection structure 18 may be formed by filling an opening penetrating through the dielectric layer 16 and the etching stop layer 14 with an electrically conductive material and performing a planarization process so as to remove the electrically conductive material located outside the opening, and the top surface of the via connection structure 18 and the top surface of the dielectric layer 16 may be substantially coplanar, but not limited thereto. Subsequently, a first titanium layer 20 may be formed on the via connection structure 18 and the dielectric layer 16, a variable resistance material layer 22 may be formed on the first titanium layer 20, and a second titanium layer 24 may be formed on the variable resistance material layer 22. The first titanium layer 20 may directly contact the via connection structure 18 and the dielectric layer 16, and the variable resistance material layer 22 may directly contact the first titanium layer 20 and the second titanium layer 24. After the step of forming the second titanium layer 24, a patterning process 90 may be performed, and the patterning process 90 may include a photolithographic process or other suitable patterning approaches. It is worth noting that the method of forming the resistive switching element RSE in the present invention may include but is not limited to the steps illustrated in FIG. 2 and FIG. 3 described above, and the resistive switching element RSE may be formed by other suitable manufacturing methods according to some design considerations.

As shown in FIG. 2 and FIG. 3, the second titanium layer 24 may be patterned to be the titanium top electrode 24P by the patterning process 90, the variable resistance material layer 22 may be patterned to be the variable resistance material 22P by the patterning process 90, and the first titanium layer 20 may be patterned to be the titanium bottom electrode 20P by the patterning process 90. As shown in FIGS. 3-5, after the step of forming the resistive switching element RSE, a spacer material layer 26 may be formed conformally on the resistive switching element RSE and the dielectric layer 16, and an etching back process may be performed to the spacer material layer 26 for forming the spacer structure 26S on the sidewall of the resistive switching element RSE, but not limited thereto. Subsequently, as shown in FIG. 1, the dielectric layer 28, the etching stop layer 30, the dielectric layer 32, and the top connection structure 34 described above may be formed. The etching stop layer 30 may be formed on the dielectric layer 28 and the resistive switching element RSE, and the dielectric layer 32 may be formed on the etching stop layer 30. Therefore, the dielectric layer 32 may be regarded as being formed on the etching stop layer 30, the dielectric layer 28, and the resistive switching element RSE. The top connection structure 34 may be at least partially formed in the dielectric layer 32 and the etching stop layer 30, and the top connection structure 34 may penetrate through the dielectric layer 32 and the etching stop layer 30 in the vertical direction Z for contacting the titanium top electrode 24P. The top connection structure 34 may be directly connected with the titanium top electrode 24P accordingly.

In some embodiments, before the step of forming the etching stop layer 30, the dielectric layer 28 may cover the resistive switching element RSE, the spacer structure 26S, and the dielectric layer 16 in the vertical direction Z, and a planarization process has to be performed to the dielectric layer 28 for removing the dielectric layer 28 located above the resistive switching element RSE. The loading effect of the planarization process performed to the dielectric layer 28 may be lowered relatively because the total thickness of the resistive switching element RSE is reduced by using the titanium bottom electrode 20P, and it is positively helpful to improve the manufacturing yield. Relatively, when the bottom electrode is formed with other materials (such as titanium nitride or tantalum, but not limited thereto), a titanium layer has to be disposed between the bottom electrode and the variable resistance material for operating the resistive switching element, and the total thickness of the resistive switching element will become greater accordingly. In this situation, the surface undulation of the dielectric layer 28 will become more serious, manufacturing defects will be generated because of the increased loading effect of the planarization process described above, and the manufacturing yield will be affected accordingly.

As shown in FIGS. 1-6 and FIG. 8, after the step of forming the top connection structure 34 and other required processes, a forming step may be performed for forming a conductive filament CF in the variable resistance material 22P. In some embodiments, oxygen ions XN in the variable resistance material 22P may move towards the titanium bottom electrode 20P and the titanium top electrode 24P in the forming step, respectively, for forming the conductive filament CF. For example, as shown in FIG. 6 and FIG. 1, a first positive voltage V1 may be applied to the titanium top electrode 24P via the top connection structure 34 for dissociating oxygen ions XN from a part of the oxygen atoms XA in the variable resistance material 22P, and the oxygen ions XN may move towards the titanium top electrode 24P for forming oxygen vacancies OV in the variable resistance material 22P. When the first positive voltage V1 is applied to the titanium top electrode 24P, a relatively low positive voltage or a negative voltage may be applied to the titanium bottom electrode 20P or the titanium bottom electrode 20P may be electrically grounded, but not limited thereto. In addition, as shown in FIG. 7 and FIG. 1, a second positive voltage V2 may be applied to the titanium bottom electrode 20P via the via connection structure 18 for dissociating oxygen ions XN from another part of the oxygen atoms XA in the variable resistance material 22P, and the oxygen ions XN may move towards the titanium bottom electrode 20P for forming oxygen vacancies OV in the variable resistance material 22P. When the second positive voltage V2 is applied to the titanium bottom electrode 20P, a relatively low positive voltage or a negative voltage may be applied to the titanium top electrode 24P or the titanium top electrode 24P may be electrically grounded, but not limited thereto.

The conditions illustrated in FIG. 6 and FIG. 7 may be regarded as two different sub steps in the forming step, and the two sub steps may be performed alternately and/or performed repeatedly for forming the conductive filament CF composed of the oxygen vacancies OV and illustrated in FIG. 8. In some embodiments, the first positive voltage V1 may be applied to the titanium top electrode 24P first, and the step of applying the first positive voltage V1 may then be stopped and the second positive voltage V2 may be applied to the titanium bottom electrode 20P for forming the conductive filament CF by performing these steps alternately with this sequence. In another embodiments, the second positive voltage V2 may be applied to the titanium bottom electrode 20P first, and the step of applying the second positive voltage V2 may then be stopped and the first positive voltage V1 may be applied to the titanium top electrode 24P for forming the conductive filament CF by performing these steps alternately with this sequence. In other words, in the forming step, the first positive voltage V1 and the second positive voltage V2 may be alternately applied to the titanium top electrode 24P and the titanium bottom electrode 20P, respectively, for forming the conductive filament CF. Additionally, in some embodiments, the first positive voltage V1 and the second positive voltage V2 may be substantially equal to each other or different from each other according to some design considerations, the voltages required in the forming step may be reduced relatively by the approach of alternately applying the first positive voltage V1 and the second positive voltage V2, and that is beneficial for the related operations.

In some embodiments, after the step of forming the conductive filament CF by the forming step described above, the resistive switching element RSE may be kept in a low resistance state (LRS). Subsequently, the resistive switching element RSE may be switched to a high resistance state (HRS) by applying suitable voltage to the titanium bottom electrode 20P or the titanium top electrode 24P for breaking the conductive filament CF. In the high resistance state, the resistive switching element RSE may be switched back to the low resistance state by applying suitable voltage to the titanium bottom electrode 20P or the titanium top electrode 24P for forming the conductive filament CF again. The above-mention operation of switching from the low resistance state to the high resistance state may be regarded as a reset operation step, the above-mention operation of switching from the high resistance state to the low resistance state may be regarded as a set operation step, and the operation modes of the memory device, such as storing data, reading data, and resetting, may be realized by switching between the high resistance state and the low resistance state. In some embodiments, specific voltages may be applied to the titanium bottom electrode 20P, applied to the titanium top electrode 24P, or alternately applied to the titanium bottom electrode 20P and the titanium top electrode 24P in the reset operation step and the set operation step described above for achieving the required effects because the material composition of the titanium bottom electrode 20P is identical to that of the titanium top electrode 24P, and that will be a positive contribution to the flexibility of the operating approaches of the resistive memory device.

To summarize the above descriptions, in the resistive memory device and the manufacturing method thereof according to the present invention, the resistive switching element may be formed with the titanium bottom electrode, the titanium top electrode, and the variable resistance material sandwiched between the titanium bottom electrode and the titanium top electrode for reducing the total thickness of the resistive switching element and improving related manufacturing problems. The manufacturing yield may be enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistive memory device, comprising:
- a first dielectric layer;
- a via connection structure disposed in the first dielectric layer; and
- a resistive switching element disposed on the via connection structure and the first dielectric layer, wherein the resistive switching element comprises:
  - a titanium bottom electrode;
  - a titanium top electrode disposed above the titanium bottom electrode; and
  - a variable resistance material sandwiched between the titanium bottom electrode and the titanium top electrode in a vertical direction, wherein the variable resistance material is directly connected with the titanium bottom electrode and the titanium top electrode, and the titanium bottom electrode is directly connected with the via connection structure,
  - wherein a thickness of the titanium bottom electrode in the vertical direction is less than a thickness of the titanium top electrode in the vertical direction, and the thickness of the titanium bottom electrode in the vertical direction is greater than a thickness of the variable resistance material in the vertical direction.

2. The resistive memory device according to claim 1, wherein the titanium bottom electrode consists of titanium, and the titanium top electrode consists of titanium.

3. The resistive memory device according to claim 1, wherein the variable resistance material consists of a metal oxide material.

4. The resistive memory device according to claim 1, further comprising:
- a second dielectric layer disposed on the resistive switching element; and
- a top connection structure disposed in the second dielectric layer, wherein the top connection structure is directly connected with the titanium top electrode.

5. The resistive memory device according to claim 4, wherein a material composition of the top connection structure is different from a material composition of the titanium top electrode.

6. The resistive memory device according to claim 1, wherein a material composition of the via connection structure is different from a material composition of the titanium bottom electrode.

7. The resistive memory device according to claim 1, further comprising:
- a spacer structure disposed on a sidewall of the resistive switching element.

8. A manufacturing method of a resistive memory device, comprising:
- forming a via connection structure in a first dielectric layer; and
- forming a resistive switching element on the via connection structure and the first dielectric layer, wherein the resistive switching element comprises:
  - a titanium bottom electrode;
  - a titanium top electrode disposed above the titanium bottom electrode; and
  - a variable resistance material sandwiched between the titanium bottom electrode and the titanium top electrode in a vertical direction, wherein the variable resistance material is directly connected with the titanium bottom electrode and the titanium top electrode, and the titanium bottom electrode is directly connected with the via connection structure, wherein a thickness of the titanium bottom electrode in the vertical direction is less than a thickness of the titanium top electrode in the vertical direction, and the thickness of the titanium bottom electrode in the vertical direction is greater than a thickness of the variable resistance material in the vertical direction.

9. The manufacturing method of the resistive memory device according to claim 8, wherein a method of forming the resistive switching element comprises:

forming a first titanium layer on the via connection structure and the first dielectric layer, wherein the first titanium layer directly contacts the via connection structure and the first dielectric layer;

forming a variable resistance material layer on the first titanium layer, wherein the variable resistance material layer directly contacts the first titanium layer;

forming a second titanium layer on the variable resistance material layer; and performing a patterning process after the second titanium layer is formed, wherein the second titanium layer is patterned to be the titanium top electrode by the patterning process, the variable resistance material layer is patterned to be the variable resistance material by the patterning process, and the first titanium layer is patterned to be the titanium bottom electrode by the patterning process.

10. The manufacturing method of the resistive memory device according to claim 8, further comprising:

performing a forming step for forming a conductive filament in the variable resistance material, wherein the variable resistance material consists of a metal oxide material, and oxygen ions in the variable resistance material move towards the titanium bottom electrode and the titanium top electrode in the forming step, respectively, for forming the conductive filament.

11. The manufacturing method of the resistive memory device according to claim 10, wherein a first positive voltage and a second positive voltage are alternately applied to the titanium top electrode and the titanium bottom electrode, respectively, in the forming step.

12. The manufacturing method of the resistive memory device according to claim 8, wherein the titanium bottom electrode consists of titanium, and the titanium top electrode consists of titanium.

13. The manufacturing method of the resistive memory device according to claim 8, further comprising:

forming a second dielectric layer on the resistive switching element; and forming a top connection structure in the second dielectric layer, wherein the top connection structure is directly connected with the titanium top electrode.

14. The manufacturing method of the resistive memory device according to claim 13, wherein a material composition of the top connection structure is different from a material composition of the titanium top electrode.

15. The manufacturing method of the resistive memory device according to claim 8, wherein a material composition of the via connection structure is different from a material composition of the titanium bottom electrode.

16. The manufacturing method of the resistive memory device according to claim 8, further comprising:

forming a spacer structure on a sidewall of the resistive switching element.

* * * * *